United States Patent
Ogiwara et al.

(10) Patent No.: US 9,418,740 B2
(45) Date of Patent: Aug. 16, 2016

(54) SEMICONDUCTOR STORAGE DEVICE WRITING DATA INTO MEMORY CELLS USING A HALF SELECTED STATE AND A WRITE STATE

(71) Applicant: KABUSHIKI KAISHA TOSHIBA, Minato-ku (JP)

(72) Inventors: Ryu Ogiwara, Yokohama (JP); Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/638,523

(22) Filed: Mar. 4, 2015

(65) Prior Publication Data

US 2016/0071586 A1    Mar. 10, 2016

Related U.S. Application Data

(60) Provisional application No. 62/048,081, filed on Sep. 9, 2014.

(51) Int. Cl.
G11C 11/00 (2006.01)
G11C 13/00 (2006.01)
G11C 11/56 (2006.01)

(52) U.S. Cl.
CPC ........ *G11C 13/0069* (2013.01); *G11C 13/0004* (2013.01); *G11C 11/5678* (2013.01); *G11C 13/004* (2013.01)

(58) Field of Classification Search
None
See application file for complete search history.

(56) References Cited

U.S. PATENT DOCUMENTS

| 8,634,257 | B2 | 1/2014 | Hanzawa et al. | |
|---|---|---|---|---|
| 2004/0027907 | A1* | 2/2004 | Ooishi | G11C 11/15 365/226 |
| 2007/0258281 | A1* | 11/2007 | Ito | G11C 11/15 365/158 |

(Continued)

FOREIGN PATENT DOCUMENTS

| JP | 2012-238348 A | 12/2012 |
|---|---|---|
| JP | 2014-049175 A | 3/2014 |
| WO | WO 2012/032730 A1 | 3/2012 |

OTHER PUBLICATIONS

Junji Tominaga, et al., "Electrical-field induced giant magnetoresistivity in (non-magnetic) phase change films", Applied Physics Letters, vol. 99, 2011, 4 Pages.

(Continued)

*Primary Examiner* — Son Dinh
*Assistant Examiner* — Sultana Begum
(74) *Attorney, Agent, or Firm* — Oblon, McClelland, Maier & Neustadt, L.L.P.

(57) ABSTRACT

A memory includes BLs and WLs. Resistance-change memory elements are connected between the BLs and the WLs via selection gates, respectively. A BL driver applies a voltage to a selected BL among the BLs. A WL driver applies a voltage to a selected WL among the WLs. In a write operation, the BL driver and the WL driver apply a first voltage between a reference voltage and a write voltage to selection candidate memory elements connected to the selected BL or the selected WL among the memory elements to bring the selection candidate memory elements to a half-selected state. The BL driver and the WL driver apply a second voltage to the selection candidate memory elements in the half-selected state at different timings, respectively, in order to bring the selection candidate memory elements to a write state and then return the selection candidate memory elements to the half-selected state.

20 Claims, 12 Drawing Sheets

(56) References Cited

U.S. PATENT DOCUMENTS

| | | | |
|---|---|---|---|
| 2012/0120711 A1* | 5/2012 | Rabkin | G11C 13/0069 365/148 |
| 2013/0141968 A1 | 6/2013 | Sasago et al. | |
| 2014/0063911 A1 | 3/2014 | Nojiri et al. | |
| 2014/0301130 A1* | 10/2014 | Siau | G11C 13/0069 365/148 |
| 2014/0362650 A1* | 12/2014 | Castro | G11C 13/0004 365/189.011 |

OTHER PUBLICATIONS

Youngdon Choi, et al., "A 20nm 1.8V 8Gb PRAM with 40MB/s Program Bandwidth", ISSCC 2012, Session 2, High Bandwidth DRAM & PRAM, 2.5., IEEE International Solid-State Circuits Conference, 2012, 3 Pages.

J. Tominaga, et al., "The first Principle Computer Simulation and Real Device Characteristics of Superlattice Phase-Change Memory", IEDM, IEEE, 2010, 4 Pages.

* cited by examiner

US 9,418,740 B2

SEMICONDUCTOR STORAGE DEVICE WRITING DATA INTO MEMORY CELLS USING A HALF SELECTED STATE AND A WRITE STATE

CROSS REFERENCE TO RELATED APPLICATIONS

This application is based upon and claims the benefit of priority from the prior U.S. Provisional Patent Application No. 62/048,081, filed on Sep. 9, 2014, the entire contents of which are incorporated herein by reference.

FIELD

The embodiments of the present invention relate to a semiconductor storage device.

BACKGROUND

Semiconductor storage devices such as a NAND flash memory have been downscaled to increase storage capacity. Development of memories using new materials is progressing to achieve further downscaling. Novel memories such as a resistance random access memory (ReRAM), a phase-change RAM (PRAM), a phase-change memory (PCM), an interfacial PCM (iPCM), a ferroelectric NAND-type memory (FeNAND), and a magnetic random access memory (MRAM) are developed.

Among these novel memories, the PCM and the iPCM are brought to a low resistance state (a set state) or a high resistance state (a reset state) according to phase transition of a phase-change film of the relevant memory cell. This enables the PCM and the iPCM to store therein logical data.

In the PCM and the iPCM, in some cases, an operation called "slow cooling" of slowly sinking a voltage applied to the memory cell is required to rewrite a Reset state with a Set state.

If a voltage applied to the memory cell is rapidly sunk in these cases, it is possible that the memory cell remains as the Reset state without changing from the Reset state to the Set state or returns to the Reset state even when it is temporarily changed to the Set state. On the other hand, in order to rewrite the Set state with the Reset state, it is considered that a "rapid cooling" operation of rapidly sinking a voltage applied to the memory cell is required. As described above, in the PCM and the iPCM, a control on a decrease rate of a write voltage is demanded when application of the voltage is to be stopped.

DETAILED DESCRIPTION

Embodiments will now be explained with reference to the accompanying drawings. The present invention is not limited to the embodiments.

A semiconductor storage device according to an embodiment includes a plurality of bit lines and a plurality of word lines. A plurality of resistance-change memory elements are connected between the bit lines and the word lines via selection gates, respectively. A bit line driver applies a voltage to a selected bit line among the bit lines. A word line driver applies a voltage to a selected word line among the word lines. In a data write operation, the bit line driver and the word line driver apply a first voltage between a reference voltage and a write voltage to a plurality of selection candidate memory elements connected to the selected bit line or the selected word line among the memory elements to bring the selection candidate memory elements to a half-selected state. The bit line driver and the word line driver apply a second voltage to the selection candidate memory elements in the half-selected state at different timings, respectively, in order to bring the selection candidate memory elements to a write state and then return the selection candidate memory elements to the half-selected state.

The following embodiments are applicable to any of current-detection memories such as a ReRAM, a PRAM, a PCM, an iPCM, a FeNAND, and an MRAM.

(First Embodiment)

Figure 1:
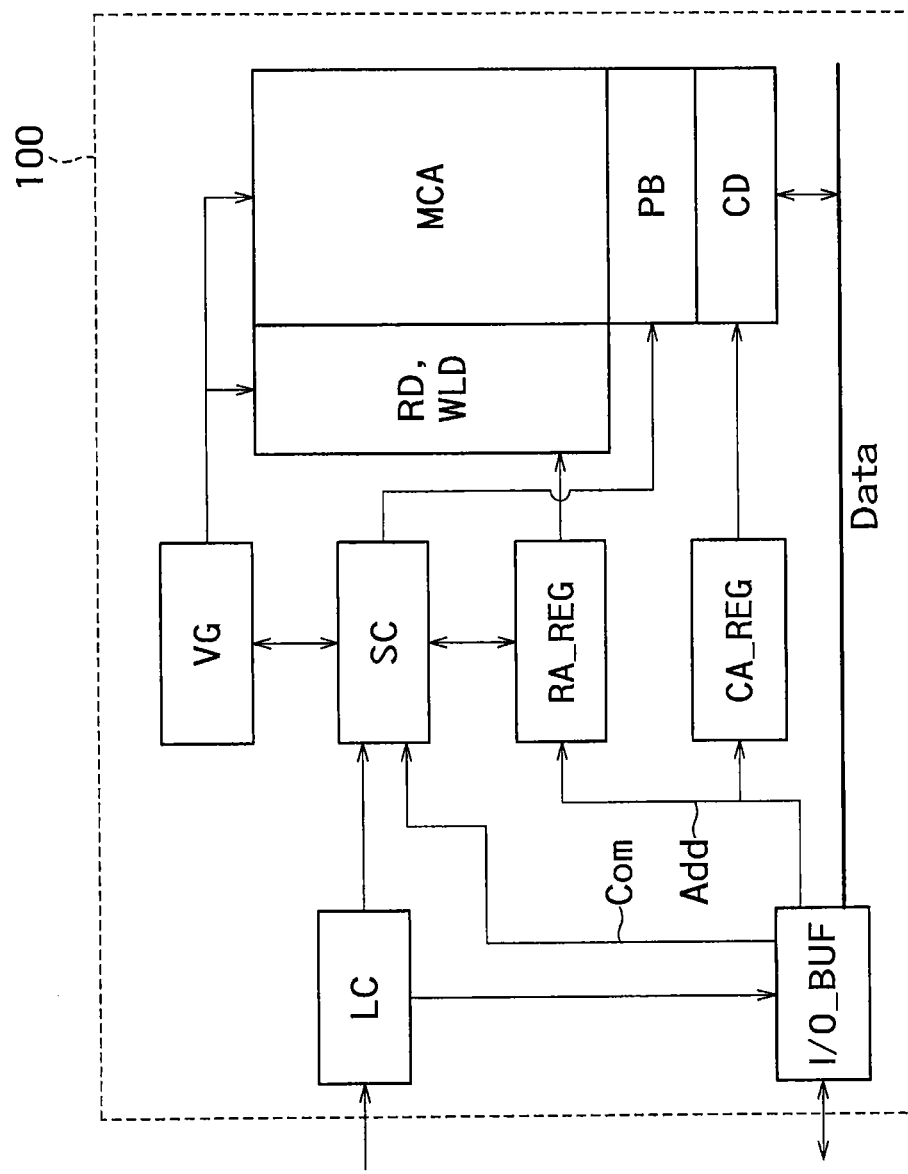
FIG. 1 is a block diagram showing an example of a configuration of a memory 100 according to a first embodiment.

FIG. 1 is a block diagram showing an example of a configuration of a memory 100 according to a first embodiment. The memory 100 includes a memory cell array MCA, a page buffer PB, a column decoder CD, a word line driver WLD, a row decoder RD, an internal-voltage generation circuit VG, a sequence controller SC, a logic controller LC, a row address register RA_REG, a column address register CA_REG, and an input/output (I/O) buffer I/O_BUF. The internal-voltage generation circuit VG includes a step-up circuit that generates a step-up potential higher than that of an external power supply VDD with a charge pump circuit, a source-follower step-down transistor, a circuit that generates an internal step-down potential from that of the external power supply VDD with a PMOS (P-type Metal-Oxide-Semiconductor) feedback circuit, a BGR (Band-Gap-Reference) circuit serving as a reference-potential generation circuit that generates a constant potential regardless of temperatures and power supply voltages, a power-on detection circuit that detects rising of the external power supply potential to a value equal to or larger than a certain value, and the like (not shown). In FIG. 1, the step-up potential is supplied to the memory cell array MCA, the row decoder RD, and the word line driver WLD. The step-down potential is supplied to the page buffer PB, the column decoder CD, the sequence controller SC, the row address register RA_REG, and the column address register CA_REG.

The memory cell array MCA includes a plurality of memory cells MC arranged two-dimensionally or three-dimensionally. The row decoder RD and the word line driver WLD selectively step up or drive one of word lines of the memory cell array MCA.

The column decoder CD and the page buffer PB read data of a memory cell MC via a selected bit line or bit line pair and temporarily store therein the read data. The column decoder CD and the page buffer PB function as a bit line driver and temporarily store therein write data to write the write data to a memory cell MC via a selected bit line or bit line pair. The page buffer PB includes a sense amplifier circuit and a data retention circuit and performs read and write of data in units of pages of the memory cell array MCA.

The row address register RA_REG receives a row address signal via the I/O buffer I/O_BUF and retains the row address signal therein. The column address register CA_REG receives a column address signal via the I/O buffer I/O_BUF and retains the column address signal therein. The row address register RA_REG and the column address register CA_REG transfer the row address signal and the column address signal (hereinafter, also "address signal Add") to the row decoder RD and the column decoder CD, respectively.

Based on a control signal (hereinafter, also "command Com") such as a chip enable signal, a command enable signal, an address-latch enable signal, a write enable signal, or a read enable signal, the logic controller LC controls input of the command Com or the address signal Add and also controls input/output of data Data (the read data or the write data). A read operation or a write operation is performed according to the command Com. Upon receipt of the command Com, the sequence controller SC performs a sequence control on read, write, or erase.

The internal-voltage generation circuit VG is controlled by the sequence controller SC and generates or supplies predetermined voltages required for various operations.

The I/O buffer I/O_BUF outputs the read data from the column decoder CD to outside or transfers the write data from outside to the column decoder CD. In addition, the I/O buffer I/O_BUF receives the command Com and the address signal Add.

Figure 2:
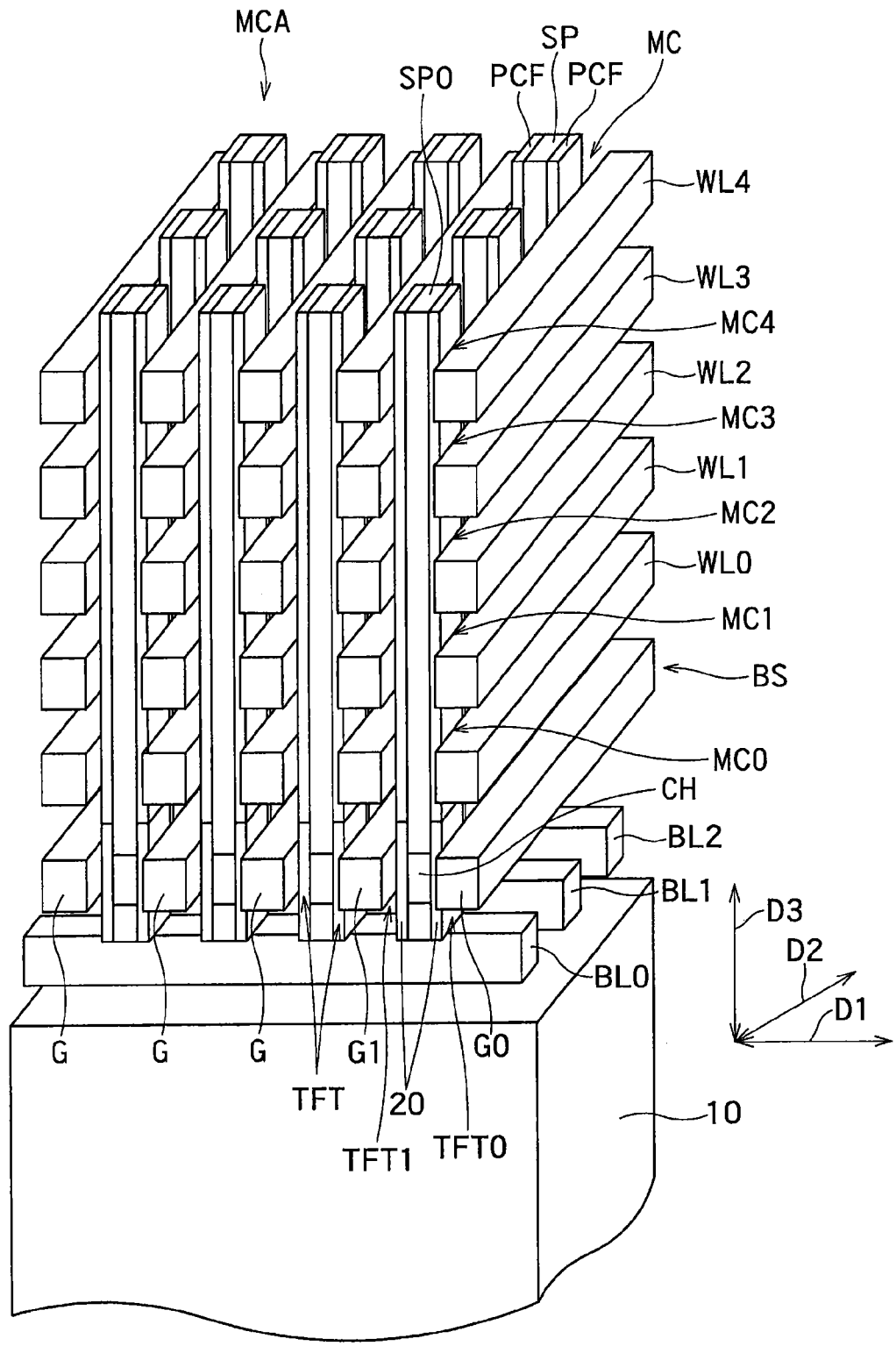
FIG. 2 is a perspective view showing an example of the configuration of the memory 100 according to the first embodiment.

FIG. 2 is a perspective view showing an example of the configuration of the memory 100 according to the first embodiment. In the present embodiment, the memory 100 is a three-dimensionally stacked PCM or a three-dimensionally stacked iPCM.

The memory 100 includes bit lines BL0 to BL2, word lines WL including word lines WL0 to WL4, block selectors BS, phase-change films PCF, and semiconductor pillars SP. The numbers of the bit lines, the word lines, the block selectors BS, the phase-change films PCF, and the semiconductor pillars SP are not particularly limited.

The bit lines BL0 to BL2 (hereinafter, also collectively "bit lines BL") extend in a direction D1 and are arrayed in a direction D2 substantially orthogonal to the direction D1. That is, the bit lines BL0 to BL2 are arrayed in a plan parallel to a surface of a semiconductor substrate 10. An interlayer dielectric film (not shown) is filled between adjacent ones of the bit lines BL and the bit lines BL are electrically isolated from each other.

The word lines WL extend in the direction D2 and are arrayed in the direction D1 and a direction D3. The direction D3 is a direction perpendicular to the directions D1 and D2. That is, the word lines WL are arrayed in planes parallel to the surface of the semiconductor substrate 10 and are stacked in a direction perpendicular to the surface of the semiconductor substrate 10. Accordingly, the word lines WL are arrayed three-dimensionally (sterically). Word lines WL arrayed in the direction D3 (longitudinally) on the right end in FIG. 2 are denoted by WL0 to WL4, respectively. An interlayer dielectric film (not shown) is filled between adjacent ones of the word lines WL and the word lines WL are electrically isolated from each other.

The semiconductor pillars SP (silicon pillars, for example) extend in the direction D3 (the direction perpendicular to the surface of the semiconductor substrate 10) on the bit lines BL to be arranged in the directions D1 and D2 in a matrix and to be located between ones of the word lines WL adjacent in the direction D1. The phase-change films PCF are provided on side surfaces of each of the semiconductor pillars SP and are located between the semiconductor pillars SP and the word lines WL, respectively. The word lines WL face the opposite side surfaces of each of the semiconductor pillars SP with the phase-change films PCF interposed therebetween, respectively. Data can be stored by causing phase transition of a phase-change film PCF corresponding to an intersection between a word line WL and a semiconductor pillar SP.

Each of the memory cells MC as memory elements is constituted by a phase-change film PCF corresponding to an intersection between a word line WL and a semiconductor pillar SP and stores data in the phase-change film PCF. The memory cells MC are arrayed three-dimensionally in the directions D1 to D3 to constitute the memory cell array MCA. The memory cells MC are connected between the bit lines BL and the word lines WL via the block selector BS and the semiconductor pillars SP. The word line driver WLD and the page buffer PB thus selectively apply a voltage to a memory cell MC via the corresponding word line WL and the corresponding bit line BL.

Each of the block selectors BS serving as selection gates includes a TFT (Thin Film Transistor) provided between a bit line BL and the memory cell array MCA. The TFTs are provided on parts of the semiconductor pillars SP near the bit lines BL and selectively electrically connect the semiconductor pillars SP to the bit lines BL, respectively. Accordingly, each of the bit lines BL is connected to one end of the corresponding semiconductor pillar SP via the corresponding TFT. Each of the TFTs includes a gate G, a gate dielectric film 20, and a channel portion CH. The gates G extend in the direction D2 and are arrayed in the direction D1. That is, while arrayed in a plan parallel to the surface of the semiconductor substrate 10 similarly to the bit lines BL, the gates G extend in a direction substantially orthogonal to the bit lines BL. The gate dielectric films 20 are provided between the channel portions CH in the semiconductor pillars SP and the gates G, respectively. The gates G face the channel portions CH with the gate dielectric films 20 interposed therebetween, respectively. The channel portions CH are provided in the semiconductor pillars SP at parts near the bit lines BL. Because the gates G are provided on the opposite sides of each of the semiconductor pillars SP in the direction D1, the TFTs are provided on the opposite sides of each of the semiconductor pillars SP in the direction D1.

To select one of the memory cells MC in a data read or data write operation, a block select driver (not shown) and the word line driver WLD selectively drive one of the gates G and selectively drives one of the bit lines BL and one of the word lines WL. One of the TFTs corresponding to the selected gate G is turned on and the TFT on one side of the corresponding semiconductor pillar SP (the channel portion CH) electrically connects the driven bit line BL and the semiconductor pillar SP with each other. By then providing a voltage difference between the selected bit line BL and the selected word line WL, a voltage is applied to a selected memory cell MC. In this way, data is written to the memory cell MC or data is read from the memory cell MC.

For example, when a memory cell MC0 is to be selected, a voltage is selectively applied to a gate G0 to turn a TFT0 on. Accordingly, a semiconductor pillar SP0 and the bit line BL0 are electrically connected with each other. In this state, the bit line BL0 and the word line WL0 are selectively driven. Consequently, the memory cell MC0 is selected, which enables data to be written to the memory cell MC0 or data to be read from the memory cell MC0.

While receiving a voltage from the selected bit line BL0, unselected memory cells MC among memory cells MC formed in the semiconductor pillar SP0 other than the selected memory cell MC0 receive no voltage from the selected word line WL0. While receiving a voltage from the selected word line WL0, unselected memory cells MC among memory cells MC corresponding to the selected word line WL0 other than the selected memory cell MC0 receive no voltage from the selected bit line BL0. The voltage of the selected bit line BL0 or the selected word line WL0 needs to be preset not to erroneously write data of the unselected memory cells MC that are receiving the voltage from either the selected bit line BL0 or the selected word line WL0 (hereinafter, also "half-selected memory cells MC").

Figure 3:
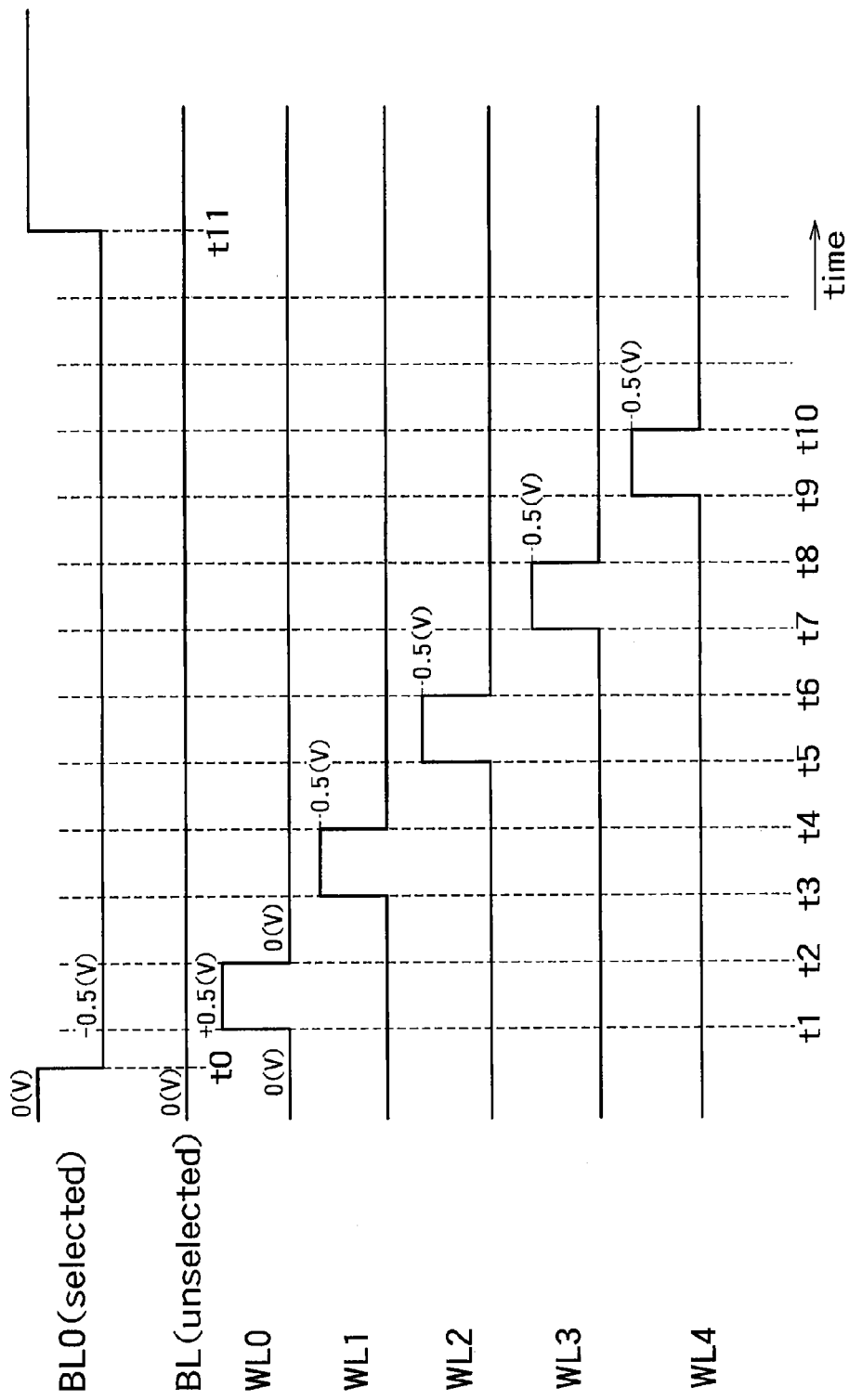
FIG. 3 is a timing chart showing an example of a data write operation of the memory 100 according to the first embodiment.
Figure 4:
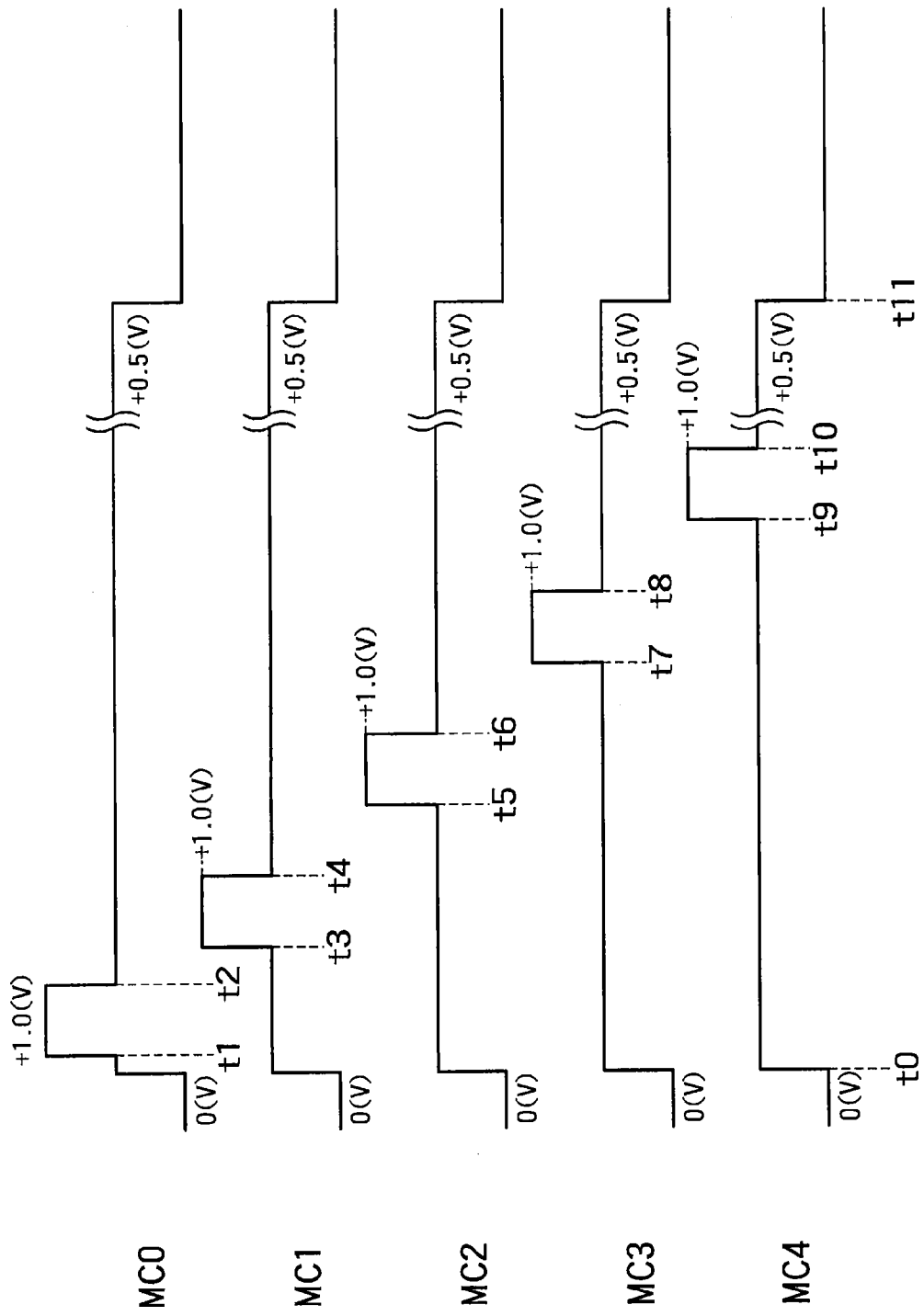
FIG. 4 is a timing chart showing voltages to be applied to memory cells MC.

FIG. 3 is a timing chart showing an example of the data write operation of the memory 100 according to the first embodiment. FIG. 4 is a timing chart showing voltages to be applied to memory cells MC. In this example, an operation to rewrite a memory cell MC in a set state with a reset state is explained.

Figure 5:
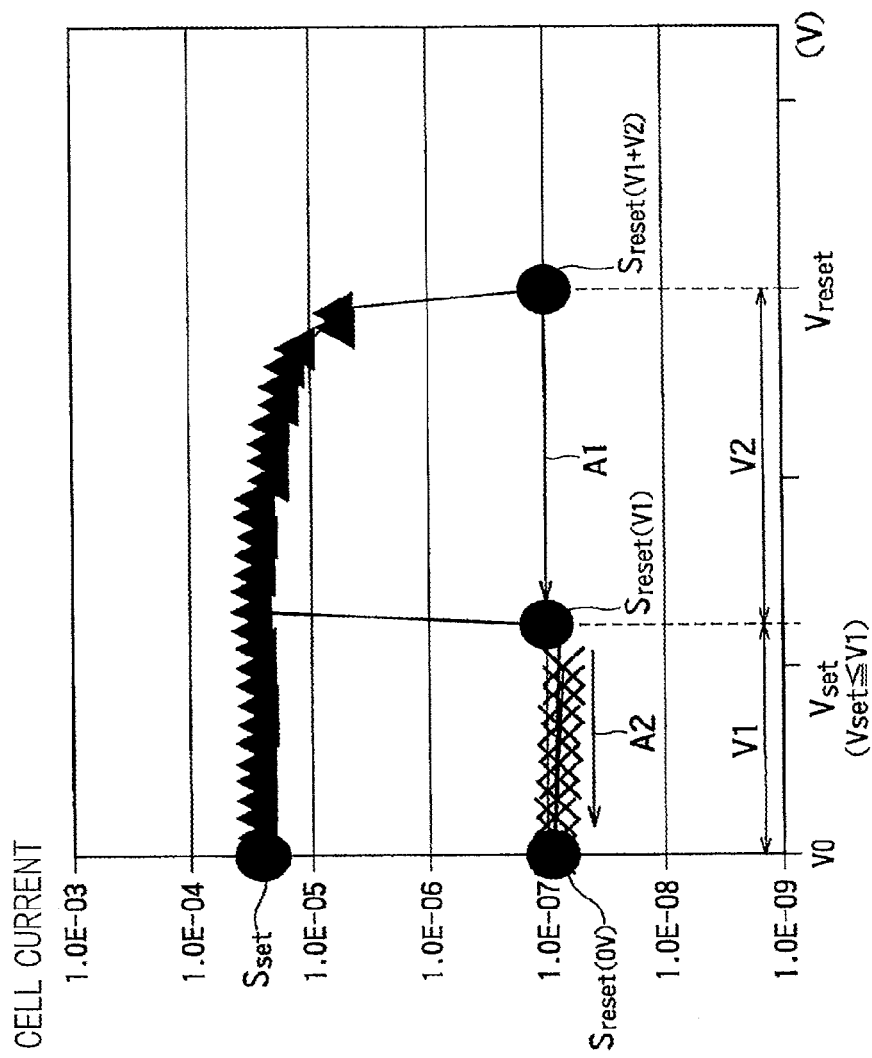
FIG. 5 shows an operation returning from a state where a write voltage is applied to a half-selected state, and an operation of returning from the half-selected state to an unselected state.

In the present embodiment, as shown in FIG. 3, the bit lines BL are set to a reference voltage (0 volt, for example) in an unselected state and is driven to a first voltage (−0.5 volt, for example) when selected. The absolute value of the first voltage is, for example, equal to or higher than an absolute value of a voltage (a set-state write voltage) for rewriting a reset state (a high resistance state) with a set state (a low resistance state) and lower than an absolute value of a voltage (a reset-state write voltage) for rewriting the set state (the low resistance state) with the reset state (the high resistance state). In the present embodiment, the first voltage is a negative voltage. As shown in FIG. 5, the reset-state write voltage is higher than the set-voltage write voltage.

The word lines WL are set to a reference voltage in an unselected state and are driven to a second voltage (+0.5 volt, for example) when selected. While also being lower in the absolute value than the write voltage, the second voltage is a positive voltage.

In the present embodiment, the voltage to be applied to a selected memory cell MC is a difference in voltages between the selected bit line BL and the selected word line WL (that is, the sum of the absolute value of the first voltage and the absolute value of the second voltage). For example, when the first voltage is −0.5 volt and the second voltage is 0.5 volt, the voltage to be applied to the selected memory cell MC is 1.0 volt. The sum of the absolute value of the first voltage and the absolute value of the second voltage is set to a value equal to or higher than the reset-state write voltage. However, the absolute value of the first voltage and the absolute value of the second voltage are smaller than the reset-state write voltage. That is, the absolute value of the first voltage and the absolute value of the second voltage are voltages intermediate between the reference voltage (0 volt, for example) and the reset-state write voltage (1.0 volt, for example), respectively, and a value obtained by adding the absolute value of the first voltage and the absolute value of the second voltage exceeds the reset-state write voltage.

The voltage to be applied to the unselected memory cells MC is a difference in voltages (substantially 0 volt) between the unselected bit lines BL and the unselected word lines WL. A voltage to be applied to the half-selected memory cells MC is a difference in voltages (about 0.5 volt, for example) between the selected bit line BL and the unselected word lines WL or between the unselected bit lines BL and the selected word line WL. When the sum of the first voltage and the second voltage is equal to or higher than the reset-state write voltage, the half-selected state is a state of a memory cell MC to which a voltage that can bring the memory cell MC to the set state or the reset state is applied.

First, in order to bring one of the TFTs of the block selectors BS shown in FIG. 2 to an on-state, corresponding one of the gates G is driven. In this case, for example, the gate G0 is driven and the TFT0 is turned on. Accordingly, the semiconductor pillar SP0 and the bit line BL0 are electrically connected with each other.

Next, at a time t0, the page buffer PB serving as the bit line driver sets a selected bit line BL (BL0, for example) to the first voltage (−0.5 volt, for example). This means that a voltage of 0.5 volt is applied to a plurality of memory cells MC provided on the opposite side surfaces of the semiconductor pillar SP0 at that time as shown in FIG. 4. That is, the memory cells MC provided on the opposite side surfaces of the semiconductor pillar SP0 are in the half-selected state. The memory cells MC electrically connected to the selected bit line BL via the TFT and the semiconductor pillar SP are thus in the half-selected state as selection candidates. Therefore, the memory cells MC electrically connected to the selected bit line BL are hereinafter referred to as "selection candidate memory cells MC". When the gate G0 is selected, the memory cells MC0 to MC4 are the selection candidate memory cells MC.

Between times from t1 to t2, the word line driver WLD selects the word line WL0 and applies the second voltage (+0.5 volt, for example) to the word line WL0. Accordingly, the memory cell MC0 (FIG. 2) among the selection candidate memory cells MC is selected and a voltage difference (1.0 volt, for example) between the selected bit line BL0 and the selected word line WL0 is applied to the selected memory cell MC0. In this way, the reset-state write voltage is applied to the selected memory cell MC0 and the phase-change film PCF of the selected memory cell MC0 is transitioned to the phase of the reset state.

After the reset-state write voltage is applied, the word line driver WLD returns the voltage of the selected word line WL0 to the reference voltage at the time t2. At that time, the selected bit line BL0 keeps applying the first voltage to the selection candidate memory cells MC including the selected memory cell MC0. Therefore, the selected memory cell MC0 is returned to the half-selected state and becomes the same state as that of other selection candidate memory cells MC.

Next, between times from t3 to t4, the word line driver WLD selects the word line WL1 and applies the second voltage (+0.5 volt, for example) to the word line WL1. Accordingly, the memory cell MC1 among the selection candidate memory cells MC is selected and a voltage difference (about 1.0 volt) between the selected bit line BL0 and the selected word line WL1 is applied to the selected memory cell MC1. In this way, the reset-state write voltage (1.0 volt, for example) is applied to the selected memory cell MC1 and the phase-change film PCF of the selected memory cell MC1 is transitioned in the phase.

After the write voltage is applied, the word line driver WLD returns the voltage of the selected word line WL1 to the reference voltage at the time t4. At that time, the selected bit line BL0 keeps applying the first voltage to the selection candidate memory cells MC including the selected memory cell MC1. Therefore, the selected memory cell MC1 returns to the half-selected state and becomes the same state as that of other selection candidate memory cells MC.

Next, between times from t5 to t6, the word line driver WLD selects the word line WL2 and applies the second voltage (+0.5 volt, for example) to the word line WL2. Accordingly, the memory cell MC2 among the selection candidate memory cells MC is selected and a voltage difference (about 1.0 volt) between the selected bit line BL0 and the selected word line WL2 is applied to the selected memory cell MC2. In this way, the reset-state write voltage (1.0 volt, for example) is applied to the selected memory cell MC2 and the phase-change film PCF of the selected memory cell MC2 is transitioned in the phase.

After the write voltage is applied, the word line driver WLD returns the voltage of the selected word line WL2 to the reference voltage at the time t6. At that time, the selected bit lines BL0 keeps applying the first voltage to the selection candidate memory cells MC including the selected memory cell MC2. Therefore, the selected memory cell MC2 is returned to the half-selected state and becomes the same state as that of other selection candidate memory cells MC.

Next, between times from t7 to t8, the word line driver WLD selects the word line WL3 and applies the second voltage (+0.5 volt, for example) to the word line WL3. Accordingly, the memory cell MC3 among the selection candidate memory cells MC is selected and a voltage difference (about 1.0 volt) between the selected bit line BL0 and the selected word line WL3 is applied to the selected memory cell MC3. In this way, the reset-state write voltage (1.0 volt, for example) is applied to the selected memory cell MC3 and the phase-change film PCF of the selected memory cell MC3 is transitioned in the phase.

After the write voltage is applied, the word line driver WLD returns the voltage of the selected word line WL3 to the reference voltage at the time t8. At that time, the selected bit line BL0 keeps applying the first voltage to the selection candidate memory cells MC including the selected memory cell MC3. Therefore, the selected memory cell MC3 is returned to the half-selected state and becomes the same state as that of other selection candidate memory cells MC.

Next, between times from t9 to t10, the word line driver WLD selects the word line WL4 and applies the second voltage (+0.5 volt, for example) to the word line WL4. Consequently, the memory cell MC4 among the selection candidate memory cells MC is selected and a voltage difference (about 1.0 volt) between the selected bit line BL0 and the selected word line WL4 is applied to the selected memory cell MC4. In this way, the reset-state write voltage (1.0 volt, for example) is applied to the selected memory cell MC4 and the phase-change film PCF of the selected memory cell MC4 is transitioned in the phase.

After the write voltage is applied, the word line driver WLD returns the voltage of the selected word line WL4 to the reference voltage at the time t10. At that time, the selected bit line BL0 keeps applying the first voltage to the selection candidate memory cells MC including the selected memory cell MC4. Therefore, the selected memory cell MC4 returns to the half-selected state and becomes the same state as that of other selection candidate memory cells MC.

The page buffer PB then returns the voltage of the selected bit line BL0 from the first voltage to the reference voltage at a time t11. In this way, the page buffer PB returns the voltage applied to the selection candidate memory cells MC0 to MC4 from the first voltage to the reference voltage. This causes the selection candidate memory cells MC0 to MC4 to simultaneously return from the half-selected state to the unselected state as shown in FIG. 4.

As described above, the memory 100 according to the present embodiment applies the first voltage to the selection candidate memory cells MC0 to MC4 connected to the selected bit line BL0 to bring the memory cells MC0 to MC4 to the half-selected state and applies the second voltage in a pulse manner to the selection candidate memory cells MC0 to MC4 in the half-selected state via the word lines WL0 to WL4 at different timings, respectively. Accordingly, the selection candidate memory cells MC0 to MC4 in the half-selected state are supplied with the write voltage temporarily at different timings, respectively, and then return to the half-selected state. After application of the reset-state write voltage to the selection candidate memory cells MC0 to MC4 is completed, the selected bit lines BL0 is returned to the reference voltage, which simultaneously returns the selection candidate memory cells MC0 to MC4 from the half-selected state to the unselected state.

FIG. 5 shows an operation of writing from the set state to the reset state, an operation of returning from a state where the reset-state write voltage is applied to the half-selected state, and an operation of returning from the half-selected state to the unselected state. The horizontal axis represents the voltage to be applied to memory cells MC. The vertical axis represents the cell current of the memory cells MC. The cell current corresponds to the resistance value of a memory cell MC and is smaller as the resistance value of a memory cell MC is higher. Therefore, in FIG. 5, $S_{set}$ denotes the set state (the low resistance state) and $S_{reset(0v)}$ denotes the reset state (the high resistance state).

When the reset state is to be written to a memory cell MC, a reset-state write voltage Vreset is temporarily applied to the memory cell MC (at the time t1, t3, t5, t7, or t9 in FIG. 3, for example). The voltage Vreset is the sum of a first voltage V1 and a second voltage V2. At that time, the state of the memory cell MC is a voltage application state $S_{reset(V1+V2)}$ in which the reset-state write voltage is applied thereto.

Application of the second voltage V2 is then stopped and the memory cell MC becomes a half-selected state $S_{reset(V1)}$ in which the first voltage V1 is applied thereto as shown by an arrow A1 in FIG. 5 (at the time t2, t4, t6, t8, or t10 in FIG. 3, for example).

Subsequently, when application of the first voltage V1 is stopped, the memory cell MC becomes an unselected state (that is, the reset-state write state) $S_{reset(0V)}$ as shown by an arrow A2 in FIG. 5 (at the time t11 in FIG. 3, for example).

In this case, the first voltage V1 is equal to or higher than a set-state write voltage Vset and is lower than the reset-state write voltage Vreset. Therefore, when a memory cell MC is to be returned from the voltage application state $S_{reset(V1+V2)}$ to the half-selected state $S_{reset(V1)}$, a decrease rate (hereinafter, also "voltage change rate") of the voltage applied to the memory cell MC can be arbitrarily set. This is because a voltage higher than the set-state write voltage is applied to the memory cell MC in a period between the voltage application state $S_{reset(V1+V2)}$ and the half-selected state $S_{reset(V1)}$ and thus it is unnecessary to consider a return to the set state.

On the other hand, in order to transition a memory cell MC from the half-selected state $S_{reset(V1)}$ to the reset-state write state $S_{reset(0V)}$, a voltage change from the first voltage V1 to a reference voltage V0 includes a voltage change from the set-state write voltage to the reference voltage V0 and thus the voltage change rate needs to be controlled. This is because the memory cell MC in the half-selected state $S_{reset(V1)}$ may be returned to the set-state write state $S_{set}$ depending on the voltage change rate from the set-state write voltage to the reference voltage V0. For example, when the slow cooling operation is required to write the reset state, the voltage change rate from the first voltage V1 to the reference voltage V0 is set low. On the other hand, when the rapid cooling operation is required to write the reset state $S_{reset(0V)}$, the voltage change rate from the first voltage V1 to the reference voltage V0 is set high. By controlling the voltage change rate from the first voltage V1 to the reference voltage V0 in this way, the memory 100 according to the present embodiment can write the reset state to the memory cell MC more reliably.

For example, it is assumed that the word line driver WLD drives the word lines WL0 to WL4 at the same time and applies the reset-state write voltage to the memory cells MC0 to MC4 provided in the semiconductor pillar SP0 at one time (a block reset system). However, in the block reset system, the current drive capacity of each of the TFTs of the block selectors BS may be insufficient because the TFT needs to supply a current to the memory cells MC0 to MC4 at the same time. Alternatively, the size (the channel width/the channel length) of the TFTs needs to be increased.

It is also assumed, for example, that the word line driver WLD and the page buffer PB synchronously drive one of the word lines WL and the bit line BL and apply the reset-state write voltage to the memory cells MC0 to MC4 in the semiconductor pillar SP0 in turn (a page reset system). However, in the page reset system, the first voltage from the bit line BL and the second voltage from one of the word lines WL are simultaneously applied to the selected memory cell MC and simultaneously fallen. That is, the write voltage (the first voltage+the second voltage) is applied to the memory cells MC0 to MC4 in a pulse manner. At that time, if the reset-state write voltage (the first voltage+the second voltage) is fallen at one time, there are cases where a memory cell MC returns to the set state without causing transition in the phase of the memory cell MC. Furthermore, in the page reset system, the word line driver WLD and the page buffer PB simultaneously apply the write voltage and cause the write voltage to simultaneously fall. Therefore, the word line driver WLD and the page buffer PB need to control the respective voltage application rates and the respective voltage decrease rates of the word lines WL and the bit line BL.

On the other hand, the memory 100 according to the present embodiment applies the first voltage to the selection candidate memory cells MC0 to MC4 connected to the selected bit line BL0 to bring the memory cells MC0 to MC4 to the half-selected state and applies the second voltage in a pulse manner to the selection candidate memory cells MC0 to MC4 in the half-selected state via the word lines WL0 to WL4 at different timings, respectively. Accordingly, it suffices that the TFT0 supplies a current to the memory cells MC0 to MC4 at different timings. Therefore, the size (the channel width/the channel length) of the TFTs of the block selectors BS can be reduced. This leads to downscaling of the memory 100.

Furthermore, according to the present embodiment, after the reset-state write voltage Vreset is applied to the memory cells MC0 to MC4, the voltages applied to the memory cells MC0 to MC4 are temporarily kept at the first voltage V1 (≥Vset) without decreased from the reset-state write voltage Vreset to the reference voltage V0. The voltages applied to the memory cells MC0 to MC4 are then decreased from the first voltage V1 to the reference voltage V0 simultaneously at a controlled voltage change rate using a transistor having a large drive force.

As explained with reference to FIG. 5, it suffices to control the voltage change rate from the first voltage V1 to the reference voltage V0 and the voltage change rate from the reset-state write voltage Vreset to the first voltage V1 can be arbitrarily set. Therefore, while the voltage change rate of the bit lines BL needs to be appropriately set to prevent the memory cells MC from returning to the set state $S_{set}$, the voltage change rate of the word lines WL can be arbitrarily set.

As shown in FIG. 3, during a period of write of the reset state, the selected bit line BL0 is simply fallen at the time t0 and raised at the time t11. An inclination of rising of the selected bit line BL0 at the time t11 corresponds to the voltage change rate from the first voltage V1 to the reference voltage V0. Meanwhile, the word lines WL0 to WL4 are raised or fallen at different timings, respectively. An inclination of falling of the word lines WL0 to WL4 corresponds to the voltage change rate from the reset-state write voltage Vreset to the first voltage V1. The inclination of falling of the word lines WL0 to WL4 can be arbitrarily set and it is unnecessary to pay much attention thereto. As described above, if the voltage change rate of the bit line BL is appropriately controlled, the memory 100 according to the present embodiment can reliably write the reset state without returning the memory cells MC to the set state during write of the reset state even when the voltage change rate of the word lines WL is arbitrarily set.

In the reset-state write operation according to the present embodiment, the word lines WL0 to WL4 are changed in turn with the selected bit line BL0 kept changed. However, a plurality of bit lines BL can be changed in turn with one of the word lines WL kept changed. Even in this operation, the effects of the present embodiment are not lost. However, in this case, while the voltage change rate of the bit lines BL can be arbitrarily set, the voltage change rate of the word lines WL needs to be appropriately set.

(First Modification)

Figure 6:
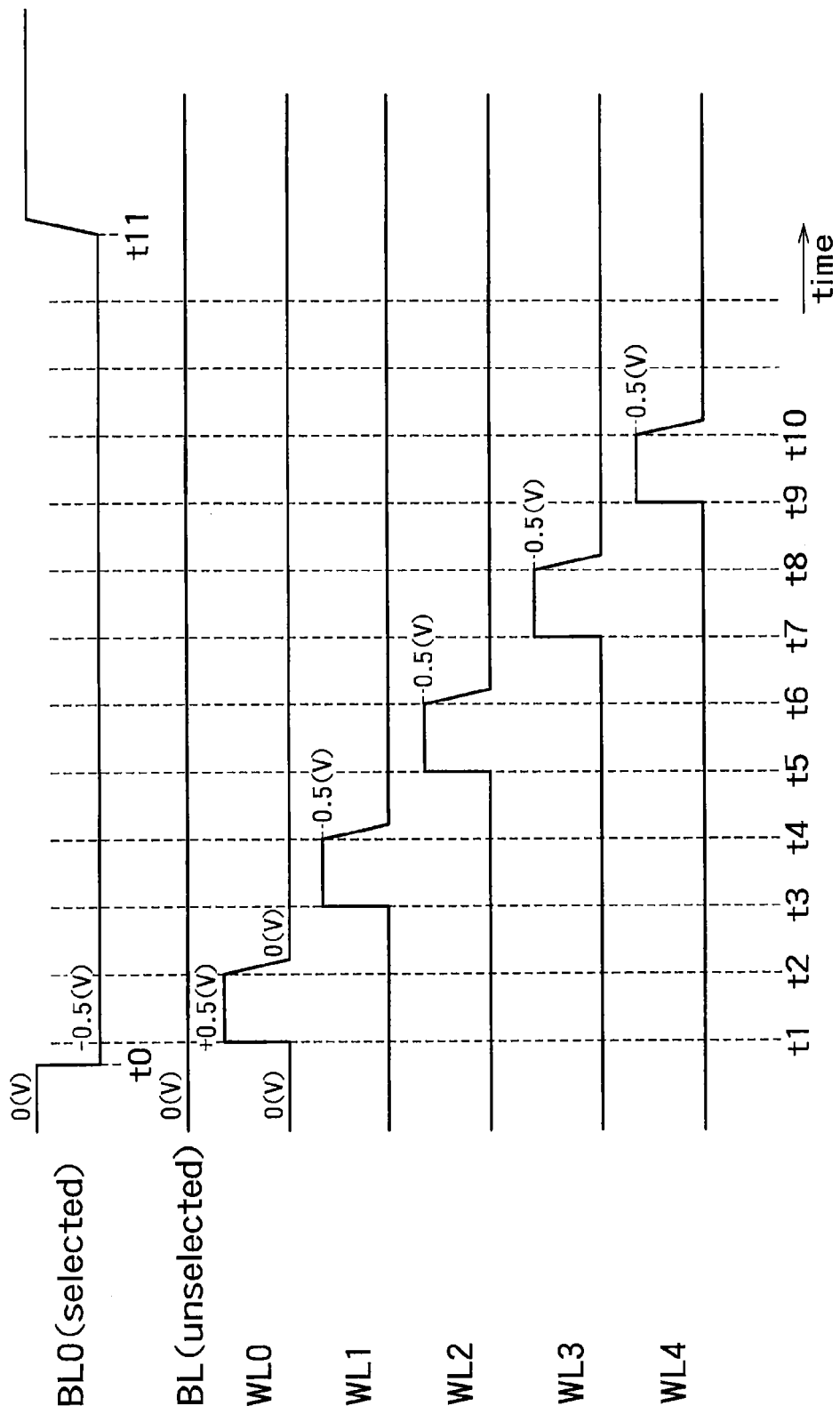
FIG. 6 is a timing chart showing an example of an operation of the memory 100 according to a first modification of the first embodiment.

FIG. 6 is a timing chart showing an example of an operation of the memory 100 according to a first modification of the first embodiment. In the first modification, both of the voltage change rate of the selected bit line BL0 and the voltage change rate of the selected word lines WL0 to WL4 are set low. It is considered that there are cases where the operation (the slow cooling operation) of slowly decreasing the voltage applied to a memory cell MC is required in write of the reset state. Generally, it is preferable to do the fast cooling operation when the reset state is written. However, in the present modification, it is possible to use the slow cooling operation for writing the reset state.

In these cases, the word line driver WLD and the page buffer PB perform the slow cooling operation until the voltage applied to the selection candidate memory cells MC0 to MC4 is changed from the reset-state write voltage (the first voltage+the second voltage) to the reference voltage (0 volt, for example). This enables the reset state to be reliably written to the memory cells MC.

In this way, in the first modification, by controlling both of the voltage change rate of the selected bit line BL0 and the voltage change rate of the selected word lines WL0 to WL4, the inclination from the reset-state write voltage to the reference voltage to be applied to the selection candidate memory cells MC0 to MC4 can be set steep or gentle.

(Second Modification)

Figure 7:
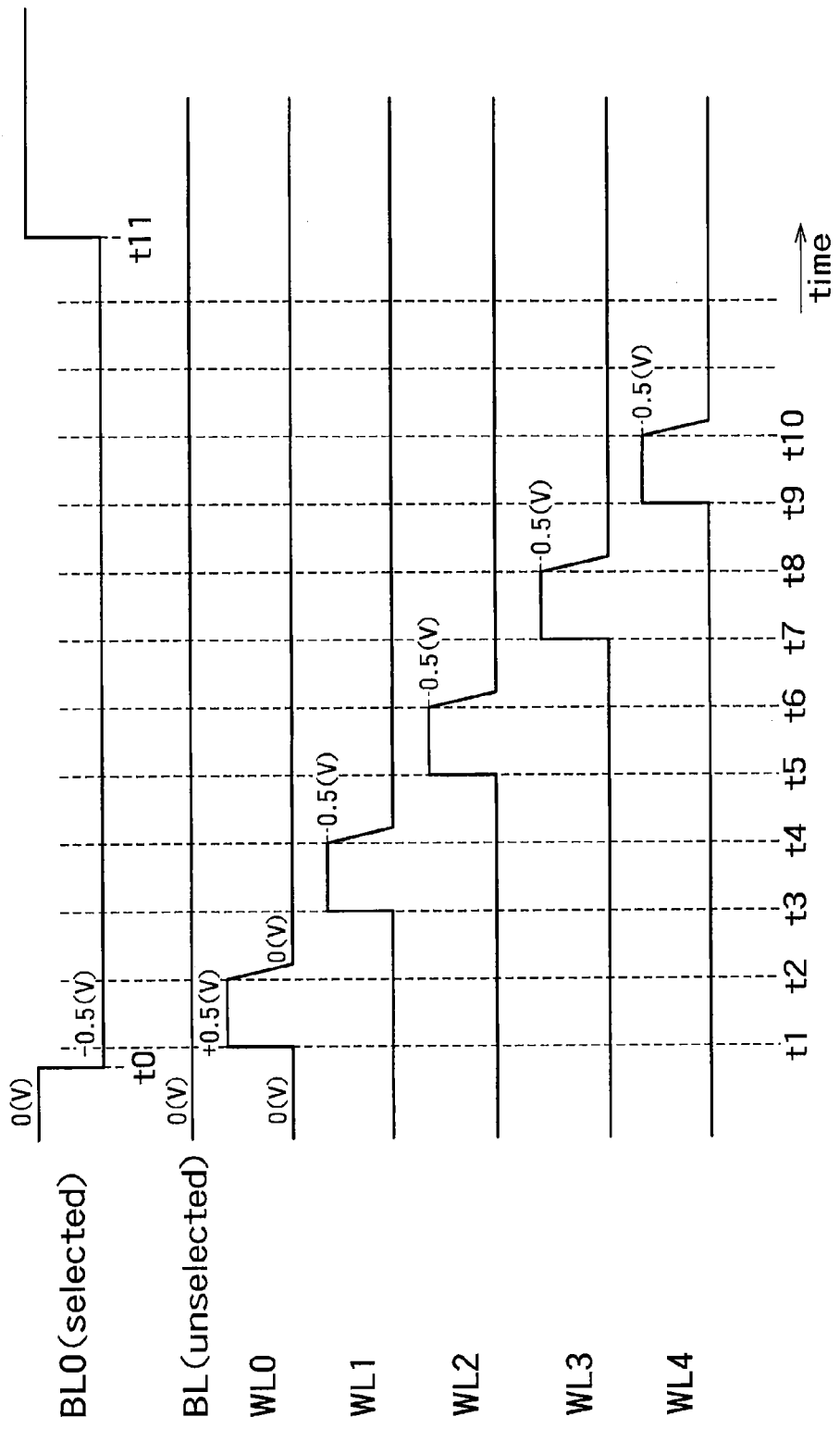
FIG. 7 is a timing chart showing an example of an operation of the memory 100 according to a second modification of the first embodiment.

FIG. 7 is a timing chart showing an example of an operation of the memory 100 according to a second modification of the first embodiment. In the second modification, the voltage change rate of the selected word lines WL0 to WL4 is set low while the voltage change rate of the selected bit line BL0 is kept high. It is considered that there are cases where the slow cooling operation is required when the voltage to be applied to a memory cell MC is returned from the reset-state write voltage to the first voltage in write of the reset state. In these cases, the word line driver WLD performs the slow cooling operation until the voltage applied to the selection candidate memory cells MC0 to MC4 is changed from the write voltage (the first voltage+the second voltage) to the first voltage. This enables the reset state to be reliably written to the memory cells MC.

In this way, in the second modification, by controlling the voltage change rate of the selected word lines WL0 to WL4, the inclination from the reset-state write voltage to the first voltage to be applied to the selection candidate memory cells MC0 to MC4 can be set steep or gentle.

(Third Modification)

Figure 8:
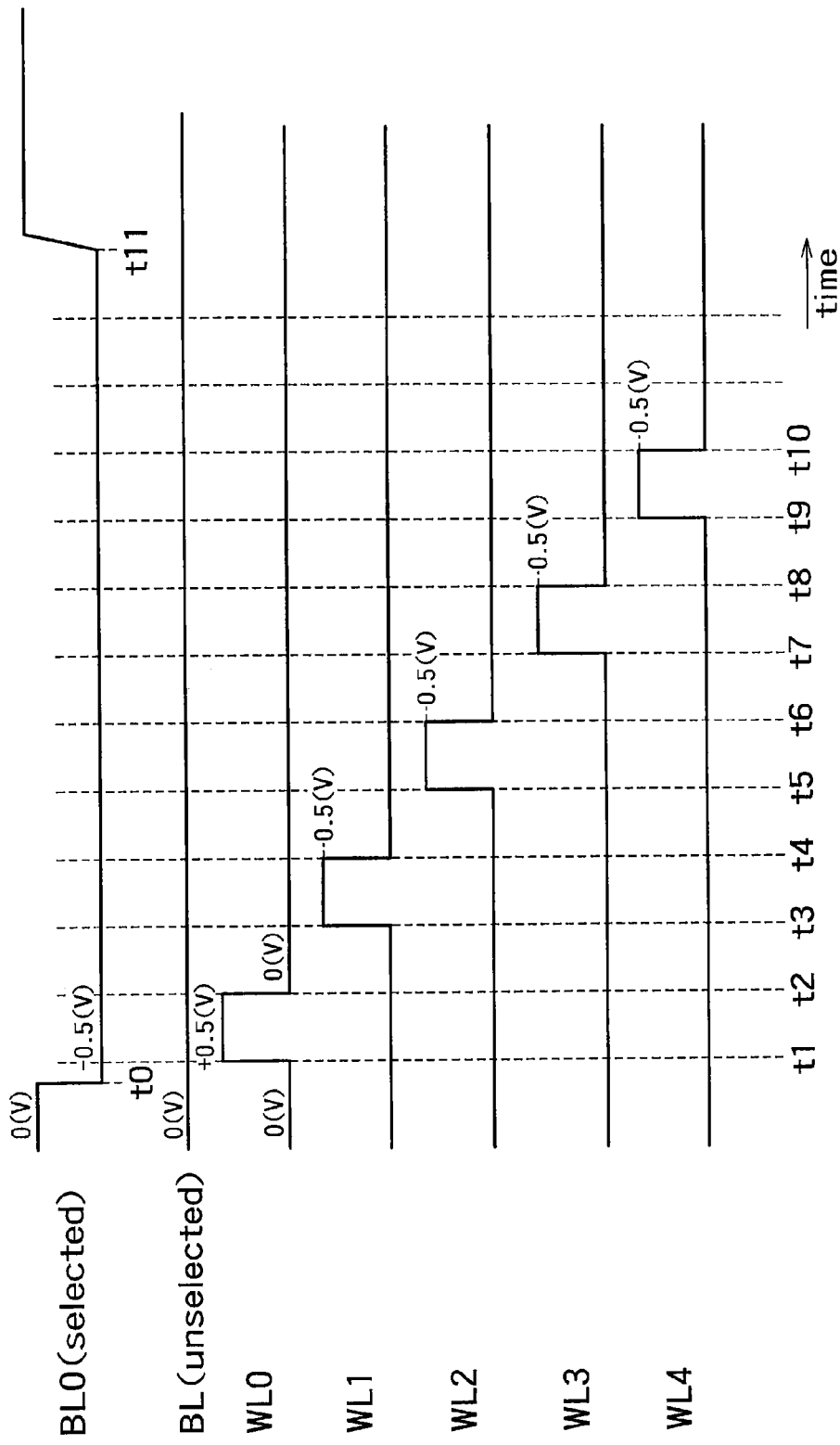
FIG. 8 is a timing chart showing an example of an operation of the memory 100 according to a third modification of the first embodiment.

FIG. 8 is a timing chart showing an example of an operation of the memory 100 according to a third modification of the first embodiment. In the third modification, the voltage change rate of the selected bit line BL0 is set low while the voltage change rate of the selected word lines WL0 to WL4 is kept high. It is considered that there are cases where the slow cooling operation is required when the voltage applied to a memory cell MC is returned from the first voltage to the reference voltage in write of the reset state. In these cases, the page buffer PB performs the slow cooling operation until the voltage applied to the selection candidate memory cells MC0 to MC4 is changed from the first voltage to the reference voltage. This enables the reset state to be reliably written to the memory cells MC.

As described above, in the third modification, by controlling the voltage change rate of the selected bit line BL0, the inclination from the first voltage to the reference voltage to be applied to the selection candidate memory cells MC0 to MC4 can be set steep or gentle.

(Fourth Modification)

Figure 9:
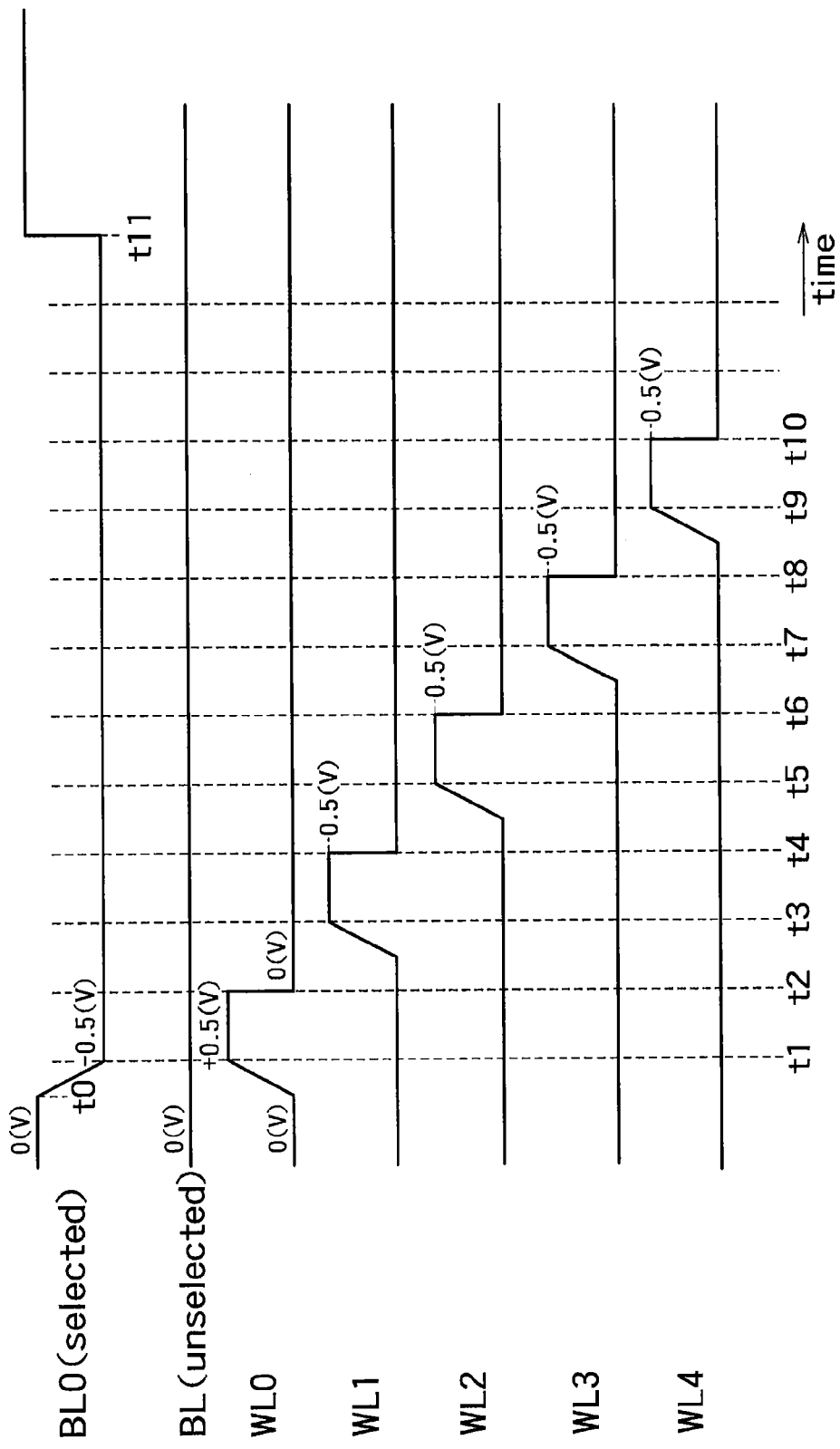
FIG. 9 is a timing chart showing an example of an operation of the memory 100 according to a fourth modification of the first embodiment.

FIG. 9 is a timing chart showing an example of an operation of the memory 100 according to a fourth modification of the first embodiment. In the fourth modification, both of the voltage change rate of the selected bit line BL0 and the voltage change rate of the selected word lines WL0 to WL4 are controlled as in the first modification. In the fourth modification, however, the word line driver WLD and the page buffer PB control an inclination of the voltage applied to the selection candidate memory cells MC0 to MC4 at the time of rising of the voltage from the reference voltage to the reset-state write voltage (the first voltage+the second voltage).

According to the fourth modification, the reset state can be reliably written to the memory cells MC when rising of the voltage applied to the selection candidate memory cells MC0 to MC4 affects write of the reset state.

(Fifth Modification)

Figure 10:
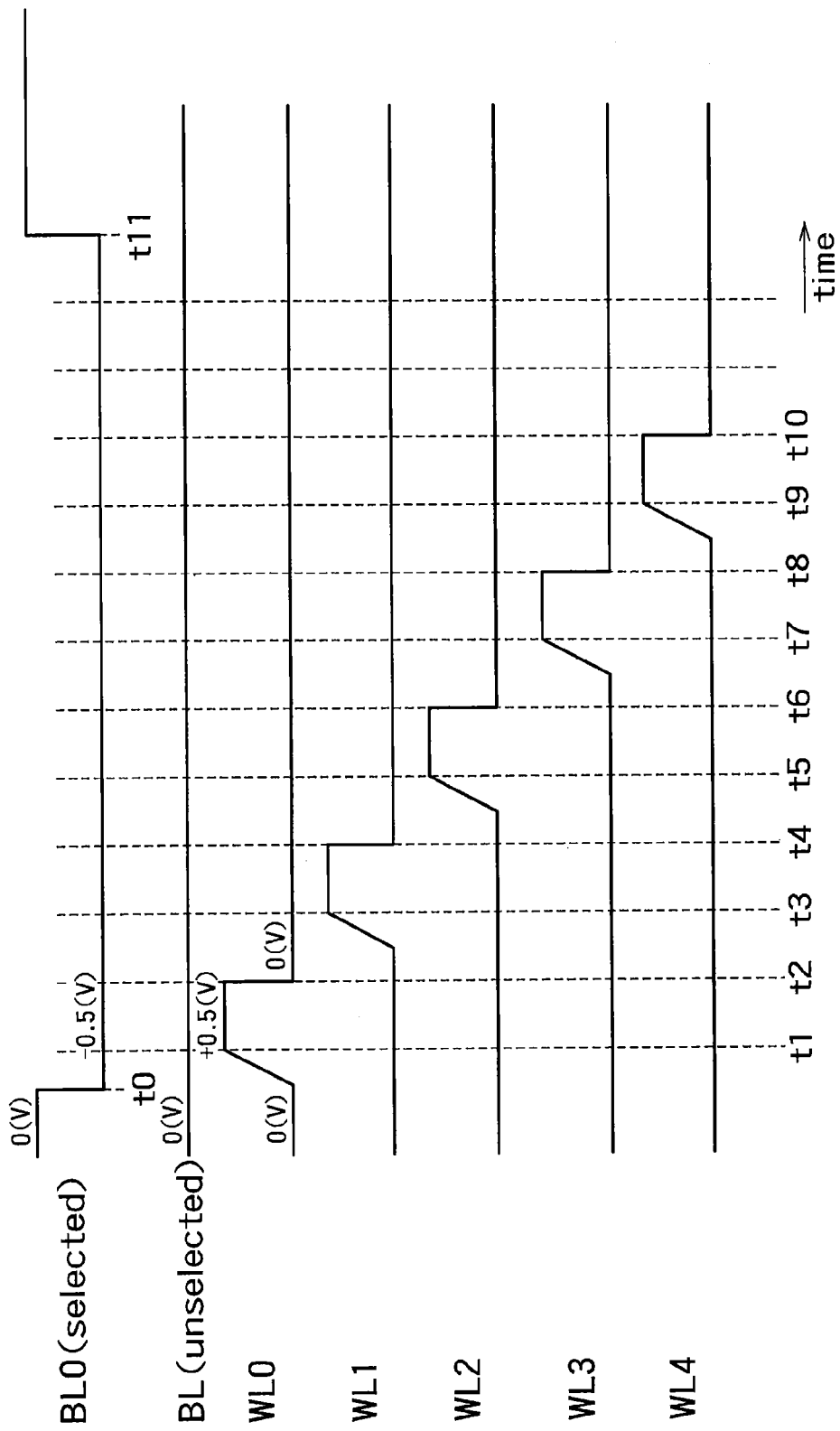
FIG. 10 is a timing chart showing an example of an operation of the memory 100 according to a fifth modification of the first embodiment.

FIG. 10 is a timing chart showing an example of an operation of the memory 100 according to a fifth modification of the first embodiment. In the fifth modification, the voltage change rate of the selected word lines WL0 to WL4 is controlled as in the second modification. In the fifth modification, however, the word line driver WLD controls an inclination of the voltage applied to the selection candidate memory cells MC0 to MC4 at the time of rising of the voltage from the reference voltage to the first voltage.

According to the fifth modification, the reset state can be reliably written to the memory cells MC when rising of the voltage applied to the selection candidate memory cells MC0 to MC4 affects write of the reset state.

(Sixth Modification)

Figure 11:
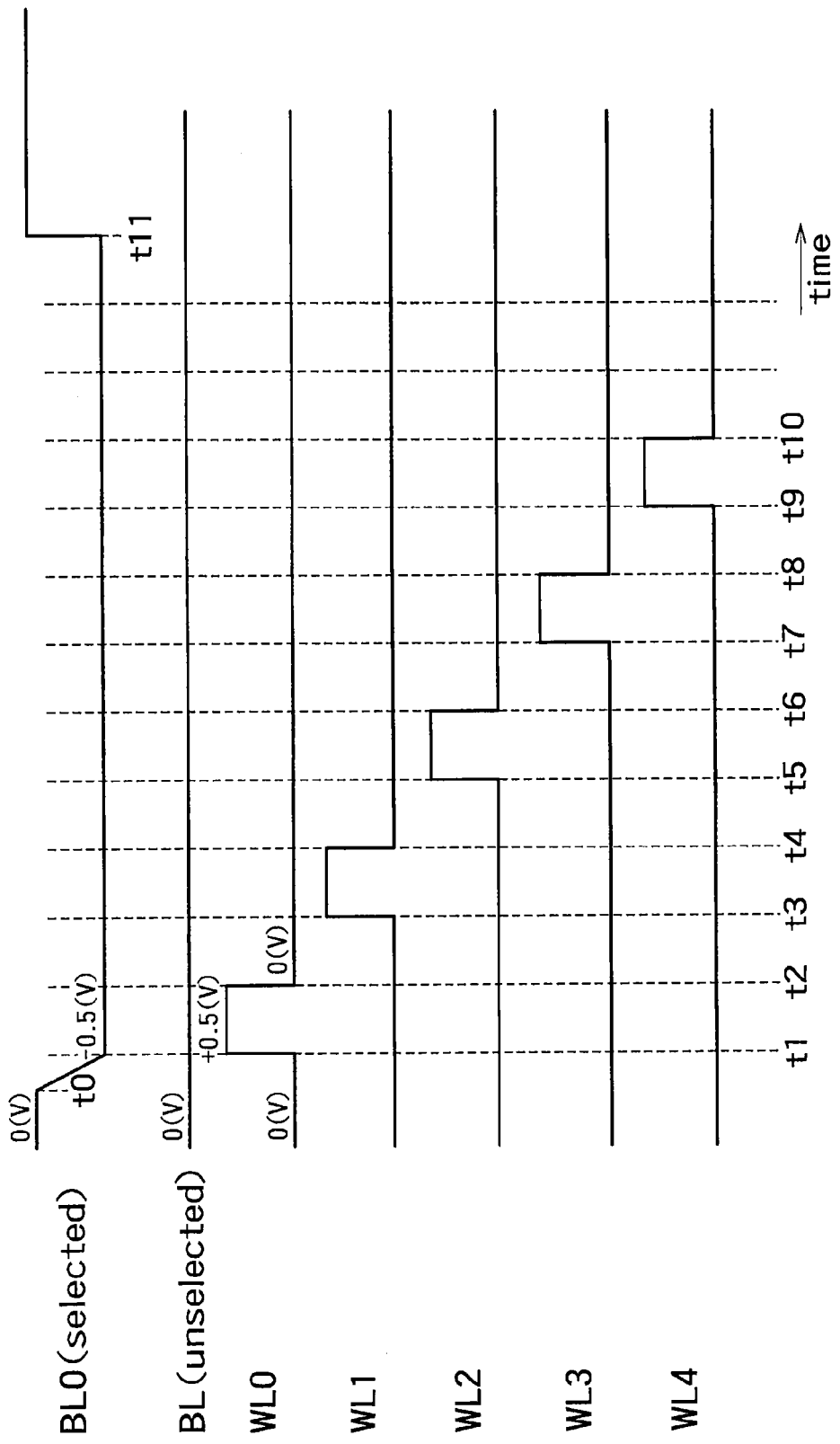
FIG. 11 is a timing chart showing an example of an operation of the memory 100 according to a sixth modification of the first embodiment.

FIG. 11 is a timing chart showing an example of an operation of the memory 100 according to a sixth modification of the first embodiment. In the sixth modification, the voltage change rate of the selected bit line BL0 is controlled as in the third modification. In the sixth modification, however, the page buffer PB controls an inclination of the voltage applied to the selection candidate memory cells MC0 to MC4 at the time of rising of the voltage from the first voltage to the reset-state write voltage.

According to the sixth modification, the reset state can be reliably written to the memory cells MC when rising of the voltage applied to the selection candidate memory cells MC0 to MC4 affects write of the reset state.

(Second Embodiment)

Figure 12:
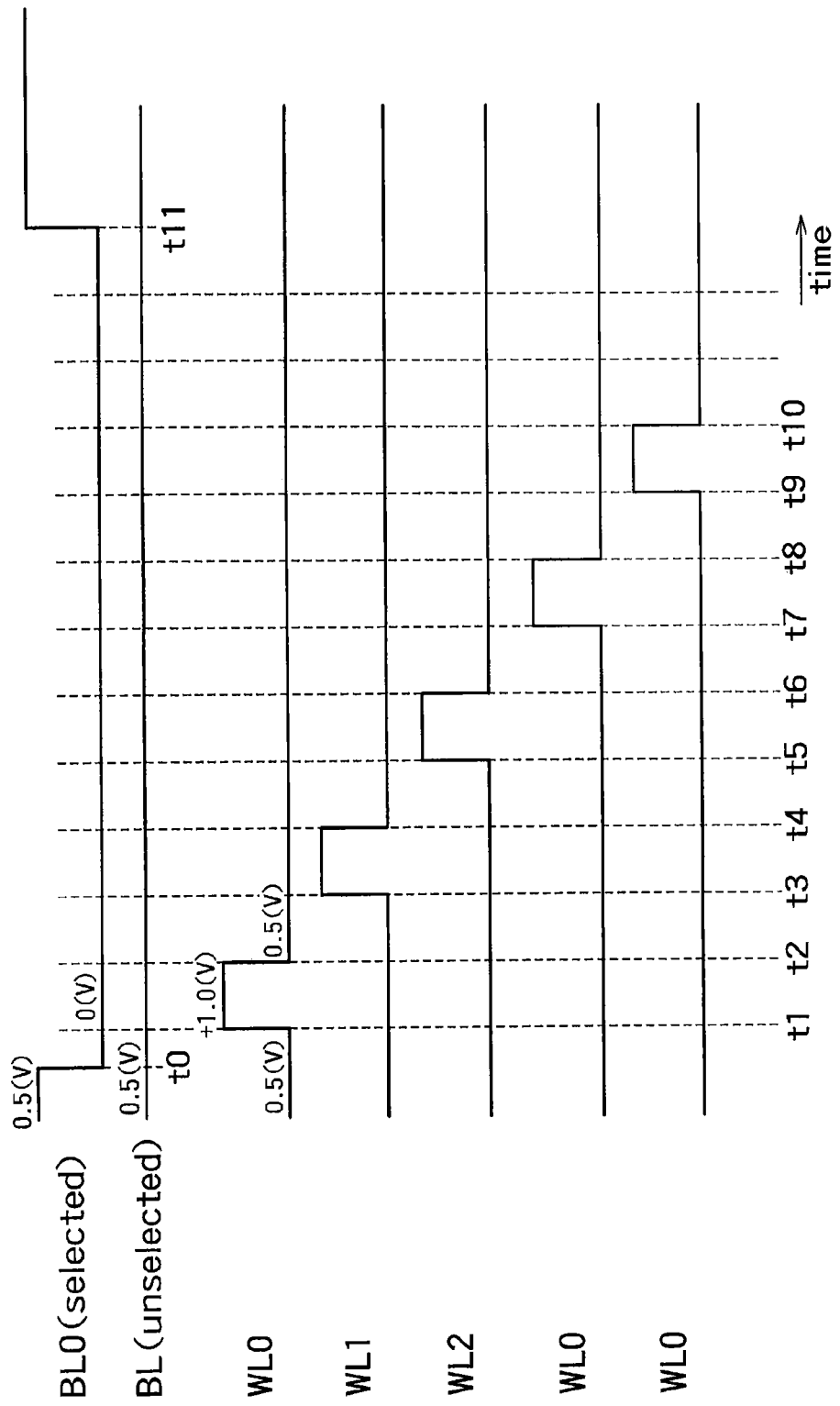
FIG. 12 is a timing chart showing an example of a data write operation of the memory 100 according to a second embodiment.

FIG. 12 is a timing chart showing an example of a data write operation of the memory 100 according to a second embodiment. A timing chart of voltages applied to the memory cells MC is the same as that of FIG. 4.

In the first embodiment, the voltage of the unselected bit lines BL is set to the reference voltage (0 volt). Therefore, the first voltage applied to the selected bit line BL0 when the memory cells MC are to be brought to the half-selected state is a negative voltage (−0.5 volt).

On the other hand, in the second embodiment, the voltage of the unselected bit lines BL is set to 0.5 volt and is offset toward a positive voltage by an absolute value of the first voltage (or by more than the absolute value of the first voltage). Therefore, the first voltage applied to the selected bit line BL0 when the memory cells MC are to be brought to the half-selected state is 0 volt substantially equal to the reference voltage (or a positive voltage) and is not a negative voltage.

In this case, the voltage of the unselected word lines WL is also shifted toward a positive voltage by the same voltage as that of the bit lines BL. For example, the voltage of the unselected word lines WL is shifted from the reference voltage (0 volt) to 0.5 volt. The voltage of the selected word lines WL is shifted from 0.5 volt to 1.0 volt.

Other configurations and operations of the second embodiment are identical to the corresponding configurations and operations of the first embodiment. Accordingly, the second embodiment can also achieve identical effects as those in the first embodiment.

Furthermore, the memory 100 according to the second embodiment can perform an identical operation to that in the first embodiment without causing the voltages of the bit lines BL and the word lines WL to be negative voltages. Positive voltages can be more easily generated by the internal-voltage generation circuit VG than negative voltages. Therefore, the second embodiment can relatively reduce the circuit scale of the internal-voltage generation circuit VG.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device, comprising:
a plurality of bit lines;
a plurality of word lines;
a plurality of resistance-change memory elements connected between the bit lines and the word lines via selection gates, respectively;
a bit line driver configured to apply a voltage to a selected bit line among the bit lines; and
a word line driver configured to apply a voltage to a selected word line among the word lines, wherein
in a data write operation, the bit line driver or the word line driver applies a first voltage between a reference voltage and a write voltage to a plurality of selection candidate memory elements connected to the selected bit line or the selected word line among the memory elements to bring the selection candidate memory elements from an unselected state to a half-selected state,
the bit line driver or the word line driver applies a second voltage to the selection candidate memory elements in the half-selected state at different timings, respectively, in order to bring the selection candidate memory elements to a write state and then return the selection candidate memory elements to the half-selected state, and
the bit line driver or the word line driver applies the reference voltage to the selection candidate memory elements to return the selection candidate memory elements to the unselected state.

2. The device of claim 1, wherein in a data write operation,
the bit line driver brings the selection candidate memory elements connected to the selected bit line to the half-selected state,
the word line driver selects the word lines at different timings to apply the second voltage to the selection candidate memory elements in the half-selected state at different timings, respectively, and
the bit line driver simultaneously returns voltages applied to the selection candidate memory elements from the first voltage to the reference voltage.

3. The device of claim 1, wherein the write voltage is a sum of an absolute value of the first voltage and an absolute value of the second voltage and is a voltage for rewriting the memory elements from a low resistance state to a high resistance state.

4. The device of claim 2, wherein the write voltage is a sum of an absolute value of the first voltage and an absolute value of the second voltage and is a voltage for rewriting the memory elements from a low resistance state to a high resistance state.

5. The device of claim 1, wherein the first voltage is a voltage having an absolute value equal to or higher than that of a voltage for rewriting the memory elements from a high resistance state to a low resistance state and lower than that of the write voltage.

6. The device of claim 2, wherein the first voltage is a voltage having an absolute value equal to or higher than that of a voltage for rewriting the memory elements from a high resistance state to a low resistance state and lower than that of the write voltage.

7. The device of claim 3, wherein the first voltage is a voltage having an absolute value equal to or higher than that of a voltage for rewriting the memory elements from a high resistance state to a low resistance state and lower than that of the write voltage.

8. The device of claim 1, wherein the bit line driver and the word line driver control a voltage change rate at a time when voltages applied to the selection candidate memory elements are to be returned from the first voltage to the reference voltage.

9. The device of claim 8, wherein the voltage change rate at a time of return from the first voltage to the reference voltage is higher than a voltage change rate at a time of return from the write voltage to the first voltage.

10. The device of claim 9, wherein the selection candidate memory elements are not rewritten from a high resistance state to a low resistance state with the voltage change rate at a time of return from the first voltage to the reference voltage.

11. The device of claim 1, wherein the bit line driver and the word line driver control a voltage change rate at a time when the write voltage applied to the selection candidate memory elements is to be returned to the first voltage.

12. The device of claim 1, wherein the bit line driver and the word line driver control a voltage change rate at a time when the selection candidate memory elements are to be changed from the reference voltage to the first voltage.

13. The device of claim 1, wherein the bit line driver and the word line driver control a voltage change rate at a time when the write voltage is to be applied to the selection candidate memory elements in a state where the first voltage is applied thereto.

14. The device of claim 1, wherein
the first voltage is a negative voltage having an absolute value smaller than that of the write voltage,
the second voltage is a positive voltage having an absolute value smaller than that of the write voltage, and
the write voltage is a sum of the absolute value of the first voltage and the absolute value of the second voltage.

15. The device of claim 1, wherein
the bit line driver applies a positive voltage corresponding to an absolute value of the first voltage to unselected bit lines among the bit lines,
the word line driver applies a positive voltage corresponding to the absolute value of the first voltage to unselected word lines among the word lines,
the first voltage is a negative voltage having an absolute value smaller than that of the write voltage,
the second voltage is a positive voltage having an absolute value smaller than that of the write voltage, and
the write voltage is a sum of the absolute value of the first voltage and the absolute value of the second voltage.

16. The device of claim 1, further comprising:
a semiconductor substrate;
a plurality of semiconductor pillars extending in a direction substantially perpendicular to a surface of the semiconductor substrate; and
a plurality of phase-change films on side surfaces of the semiconductor pillars, respectively, wherein
the word lines face the side surfaces of the semiconductor pillars with the phase-change films interposed therebetween, respectively, and are arranged three-dimensionally in directions substantially parallel to and substantially perpendicular to the surface of the semiconductor substrate,
the memory elements are located to correspond to intersections between the semiconductor pillars and the word lines, respectively, and the bit lines are connected to respective ones of ends of the semiconductor pillars via the selection gates, respectively.

17. The device of claim 1, wherein the memory elements are iPCMs or PCMs, respectively.

18. The device of claim 16, wherein the memory elements are iPCMs or PCMs, respectively.

19. The device of claim 14, wherein the selection gates are TFTs (Thin Film Transistors).

20. The device of claim 1, wherein voltages applied to the selection candidate memory elements in the half-selected state are simultaneously returned from the first voltage to the reference voltage.

* * * * *